United States Patent [19]
Lin et al.

[11] Patent Number: 6,040,217
[45] Date of Patent: Mar. 21, 2000

[54] FABRICATING METHOD OF AN ULTRA-FAST PSEUDO-DYNAMIC NONVOLATILE FLASH MEMORY

[76] Inventors: Ruei-Ling Lin, 5F-3, No. 26-12, Park II Rd., Kaohsiung-city; Ching-Hsiang Hsu, No. 100-28, Chien-Chung Rd., Hsinchu-city, both of Taiwan

[21] Appl. No.: 09/063,033

[22] Filed: Apr. 20, 1998

[51] Int. Cl.⁷ .............................................. H01L 21/8247
[52] U.S. Cl. .......................................... 438/258; 438/241
[58] Field of Search .................................. 438/257–267, 438/238–256

[56] References Cited

U.S. PATENT DOCUMENTS

| | | |
|---|---|---|
| 5,057,448 | 10/1991 | Kuroda . |
| 5,591,658 | 1/1997 | Cacharelis . |
| 5,656,544 | 8/1997 | Bergendahl et al. ................. 438/386 |
| 5,872,034 | 2/1999 | Schlais et al. ......................... 438/257 |
| 5,908,311 | 6/1999 | Chi et al. .............................. 438/258 |
| 5,930,613 | 7/1999 | Schlais et al. ......................... 438/201 |

*Primary Examiner*—Richard Booth
*Attorney, Agent, or Firm*—Blakely Sokoloff Taylor & Zafman

[57] ABSTRACT

A fabricating method of an ultra-fast pseudo-dynamic nonvolatile flash memory comprises a capacitor coupled to a local bit line. The formation of the capacitor is the characteristic of the fabricating method. In the memory structure fabricated according to the invention, the capacitor is used for the purpose of charge and discharge. The memory is operated as a normal dynamic random access memory during charging, while it is operated as a flash memory during discharging. Thus, the access speed of the memory is faster than a conventional flash memory.

30 Claims, 15 Drawing Sheets

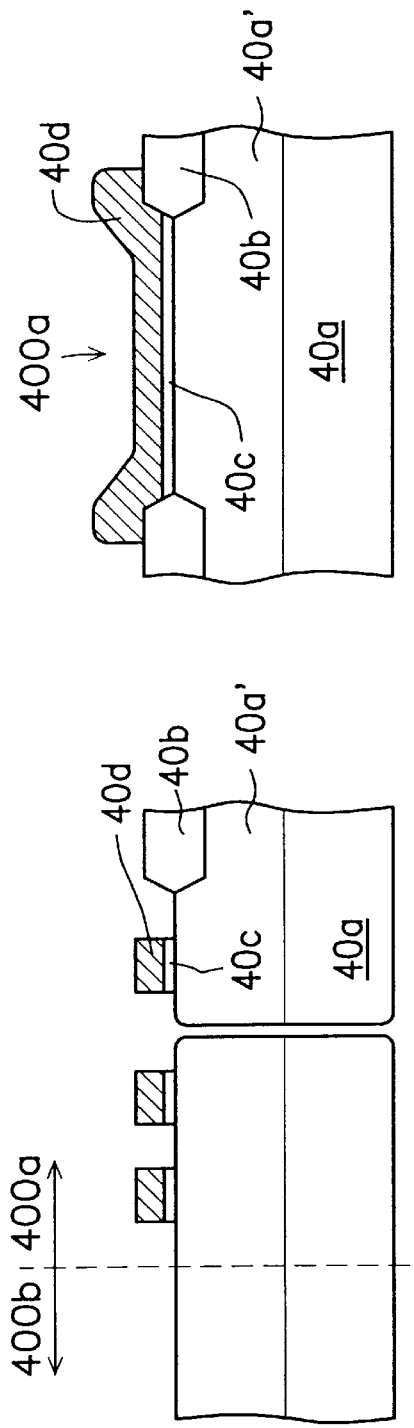
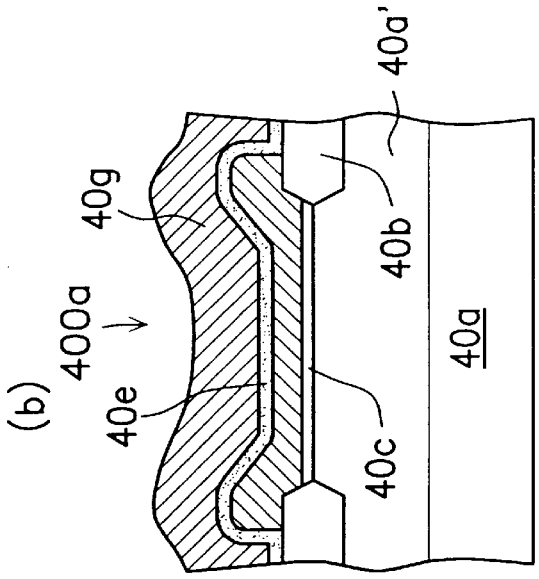
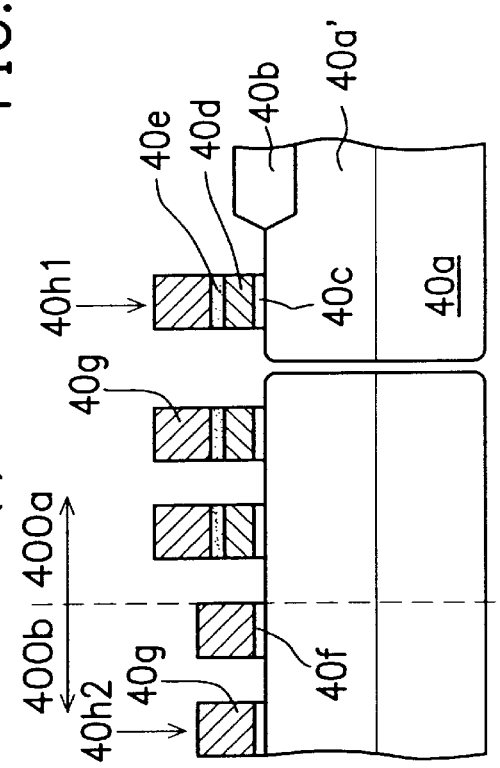
FIG. 4A
FIG. 4B

FABRICATING METHOD OF AN ULTRA-FAST PSEUDO-DYNAMIC NONVOLATILE FLASH MEMORY

BACKGROUND OF THE INVENTION

1. Field of the Invention

The invention relates to the fabricating method of a flash memory, and more particular to the fabricating method of a flash memory which comprises a structure of a dynamic random access memory (DRAM).

2. Description of the Related Art

The development of nonvolatile devices has been intensively studied and progressed very quickly. Due to the inconvenience and low density, the conventional nonvolatile device is gradually substituted by a flash memory. The flash memory is therefore becomes more and more important.

Conventional flash memory arrays can be categorized into an NAND structure and an NOR structure, which are described as follows:

In 1990, a flash memory of Bi-polarity W/E NAND structure (of which the equivalent circuit is shown as FIG. 1A) was disclosed in a paper, "A NAND Structured Cell with a New Programming Technology for Highly Reliable 5V-only Flash EEPROM", by Toshiba. The paper is published in "VLSI Technology, pp. 129–130" by R. Kirisawa et al.

In 1992, a divided bit line NOR (DINOR) structure of a flash memory array (of which the equivalent circuit is shown as FIG. 1B) was disclosed in a paper, "A Novel Cell Structure Suitable for a 3V-Only Operation, Sector Era se Flash Memory", by Mitsubishi. The paper is published in "IEEE Tech. Dig. IEDM, pp.599–602", by H. Omoda et al.

In 1994, a NOR, AND structure of a flash memory array (of which the equivalent circuit is shown as FIG. 1C) was disclosed as the paper, "A 0.4-$\mu m^2$ Self-Aligned Contactless Memory Cell Technology Suitable for 256-Mbit flash memories" by Hitachi. The paper is published in "IEEE Tech. Dig. IEDM, pp.921–923", by M. Kato et al.

In 1995, a Dual String NOR (DuSNOR) structure of a flash memory array (of which the equivalent circuit is shown as FIG. 1D. It is similar to the disclosure presented by NEC in 1993) disclosed by Samsung. The paper, "A novel Dual String NOR Memory Cell Technology Scaleable to the 256Mbit and 1 Gbit Flash Memories" is published in "IEEE Tech. Dig. IEDM, pp.263–266", by K. S. Kim et al.

In 1995, an Asymmetrical Contactless Transistor (ACT) structure of a flash memory array (of which the equivalent circuit is shown as FIG. 1E) was disclosed by Hitachi. The paper, "A New Cell Structure for Sub-quarter Micron High Density Flash Memory", is published in "IEEE Tech. Dig. IEDM, pp.267–270", by Y. Yamauchi et al.

Referring to FIG. 2 and FIG. 1A to FIG. 1E, the common part of the above flash memory array structures can be represented by an equivalent circuit shown in FIG. 2. The conventional flash memory structure comprises a select transistor $Q_{s2}$ and several memory cell transistors $Q_{m2}$. The memory cell transistors $Q_{m2}$ is connected to select transistors $Q_{s2}$ via a local bit line (LBL) or a sub-bit line (SBL). A global bit lines GBL and the SBL are gated by the select transistor $Q_{s2}$. Thus, only when the select transistor $Q_{s2}$ is selected, the SBL can be connected to the GBL. Moreover, the memory cell transistors $Q_{m2}$ are transistors with a floating gate which is, however, only a convenient way to describe a memory cell transistor. It does not mean that there is only one kind of memory cell transistor.

When the conventional flash memory is being coded or written, some select transistor $Q_{s2}$ of the memory array must be in "on" status to write a signal into the memory cell transistors $Q_{m2}$. Because the GBL voltage must be held until programming is completed, while writing a single memory cell, no signal can be written into any other memory cells sharing the same main bit line with this single memory cell before writing is completed. Namely, writing another signal of data into the main bit line has to wait until the previous coding is completed. Therefore, while coding or writing into a flash memory, there is only one coding process in act at a time in the memory cells which share the same main bit line. That is, there is only one signal allowed to write at a time. Thus, the operation speed of memory cells is limited and lowered.

SUMMARY OF THE INVENTION

It is therefore an object of the invention to provide a fabricating method of an ultra-fast pseudo-dynamic nonvolatile flash memory (UP flash memory) By coupling a capacitor to a local bit line, or serially connecting a capacitor to a controlling transistor and then to a local bit line, the operation speed of the flash memory is increased.

To achieve the objects and advantages, and in accordance with the purpose of the invention, as embodied and broadly described therein, the invention is directed towards a fabricating method of an UP flash memory. The characteristic of the UP flash memory is that there is a capacitor coupling to a local bit line. The fabricating method of the UP flash memory comprises first that a silicon substrate comprising a P-well is provided. The substrate is defined into a memory cell region and a peripheral region. In addition, a field oxide layer is formed on the substrate to achieve the electrical isolation. A first gate oxide layer and a first polysilicon layer are formed on the memory cell region of the substrate. A first N-type dopant is implanted into the first polysilicon layer. A dielectric layer, such as an oxide/nitride/oxide (ONO) layer, is formed on the memory cell region of the substrate. On the peripheral region, a second gate oxide layer is formed. A second polysilicon layer is formed over the substrate. The second polysilicon layer on the peripheral region is etched to form a gate of the peripheral region. The second polysilicon layer, the ONO layer, and the first polysilicon layer are etched to form a stack gate layer of the memory cell region. A part of the field oxide layer is removed by self-aligned source etching. The step of self-aligned source etching to remove a part of the field oxide layer is to connect the first sources. The drain of the memory cell region is lightly doped by a second N-type dopant. The LDD of periphery CMOS is formed by a third N-type dopant for N-channel device and a first P-type dopant for P-channel device, respectively. An oxide spacer is formed on the substrate. A heavily doped source/drain region in the memory cell region is doped with a fourth N-type dopant for N-channel and a second P-type dopant for P-channel, respectively. A protecting first oxide layer is formed to cover the whole device with a first opening, so that the first drain is exposed. A first tungsten plug is formed to fill the opening. After the formation of the tungsten plug, a third poly-silicon layer is formed over the substrate. A fifth N-type dopant is implanted into the third polysilicon layer which is then etched and patterned. A oxy-nitride layer is formed over the substrate and covers the entire third polysilicon layer. A first metal layer is formed over the substrate and at least fills the second opening. The metal layer is then etched and patterned. The first metal layer, the oxy-nitride layer, and the third polysilicon layer form a capacitor, and the third polysilicon layer is the local bit line.

According to the object of the invention, another fabricating method of an UP flash memory is provided. The characteristic of the UP flash memory is that there is a capacitor coupling to a local bit line. The fabricating method of the UP flash memory comprises first providing a silicon substrate comprising a P-type well. The substrate is separated into a memory cell region and a peripheral region. In addition, a field oxide layer is formed on the substrate to achieve the electrical isolation. A first gate oxide layer and a first polysilicon layer are formed on the memory cell region of the substrate. A first N-type dopant is implanted into the first polysilicon layer. A pad oxide layer and a first nitride layer are formed on the memory cell region of the substrate. The first nitride layer, the pad oxide layer, the first polysilicon layer, and the first gate oxide layer are etched to form a floating gate. A second pad oxide layer, a second nitride layer, and a first oxide layer are formed on the memory cell region of the substrate. The first oxide layer is etched to form an oxide spacer. The second nitride layer and the second pad oxide layer which are not covered by the oxide spacer are etched away. A second N-type dopant is implanted to form a first drain (medium doped). A third N-type dopant is implanted into the memory cell region to form a source. By self-aligned thermal oxidation, a self-aligned oxide layer is formed. The first nitride layer and the first oxide layer are removed to expose the first polysilicon. A second polysilicon layer is formed on the memory cell region of the substrate. A third N-type dopant is implanted into the second polysilicon layer, and the second polysilicon layer is etched and patterned. An oxide/nitride/oxide layer is formed on the memory cell region of the substrate. On the peripheral region, a second gate oxide layer is formed. A third polysilicon layer is formed over the substrate and is implanted by a fourth N-type dopant. A titanium silicide layer is formed over the third polysilicon layer. The titanium silicide layer, the third polysilicon layer, and the second gate oxide layer on the peripheral region are etched and patterned. A fifth N-type dopant is implanted into the peripheral region of the substrate to form a third drain and a third source, and connect the third source with the first and the second drain. The third polysilicon layer, the ONO layer, and the second polysilicon layer on the memory cell region are etched. A first P-type dopant is implanted into the memory cell region of the substrate region to form a P-type doped region. A second oxide layer is formed over the substrate with an opening formed therein, so that the first and the second drain is exposed within the opening. A tungsten plug is formed to fill the opening. On the second oxide layer, a fourth polysilicon layer is formed and connects the tungsten plug. A sixth N-type dopant is implanted into the fourth polysilicon layer. The fourth polysilicon layer is then etched and patterned. An oxy-nitride layer is formed and covers the entire fourth polysilicon layer. The oxy-nitride layer is then etched and patterned to expose the tungsten plug. A metal layer is formed over the substrate. The metal layer is then etched and patterned.

The metal layer, the oxy-nitride layer, and the fourth polysilicon layer on the memory cell region form a capacitor, and the fourth polysilicon layer on the memory cell region is the local bit line.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate on embodiment of the invention and together with the description, serve to explain the principles of the invention. In the drawings.

FIGS. 4A to 4F are cross sectional views of the fabricating process of the memory structure in FIG. 4;

DESCRIPTION OF THE PREFERRED EMBODIMENT

Figure 1A:
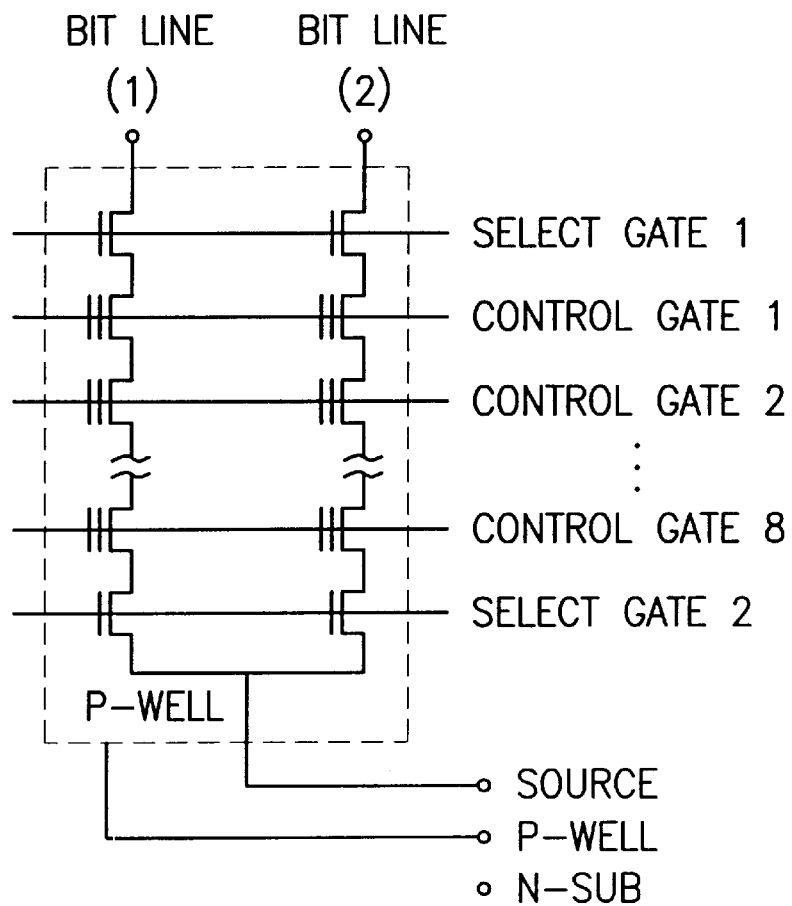
FIGS. 1A to 1E shows various conventional structures of flash memory arrays.
Figure 1B:
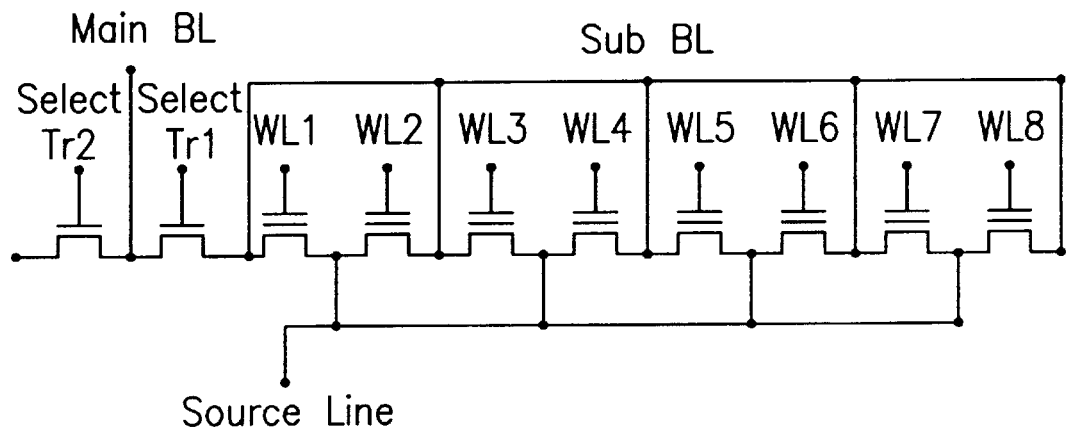
Figure 1C:
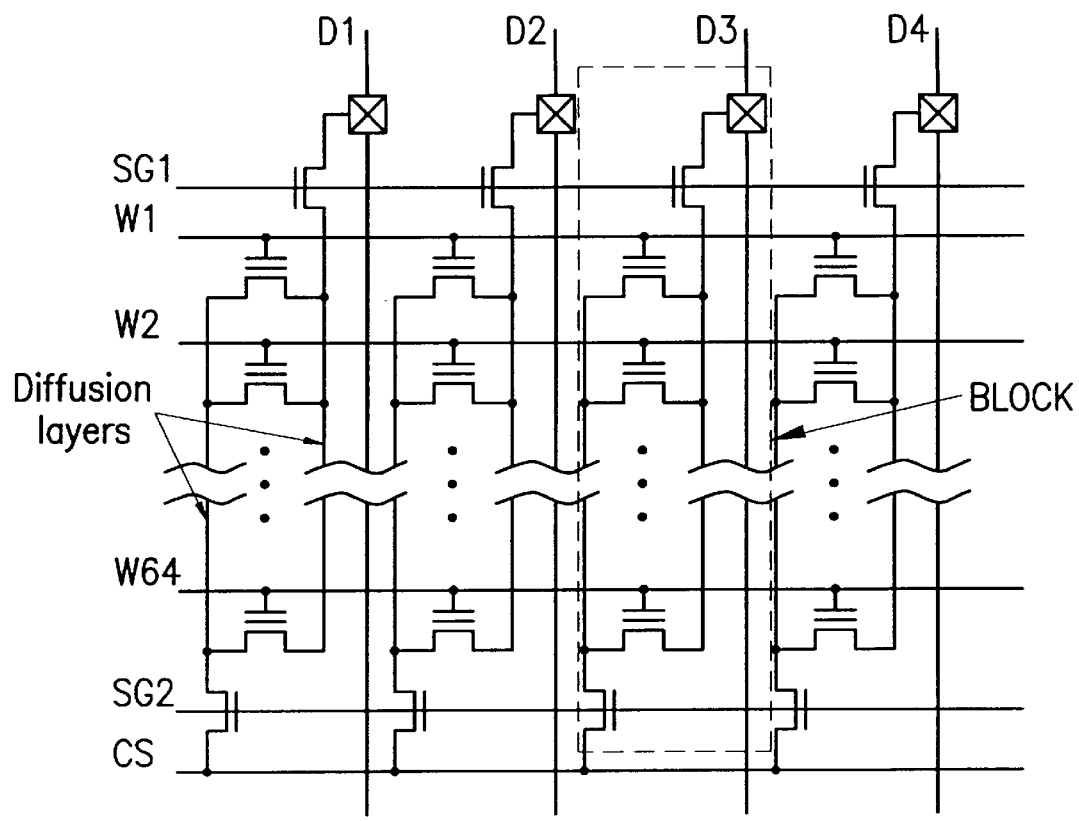
Figure 1D:
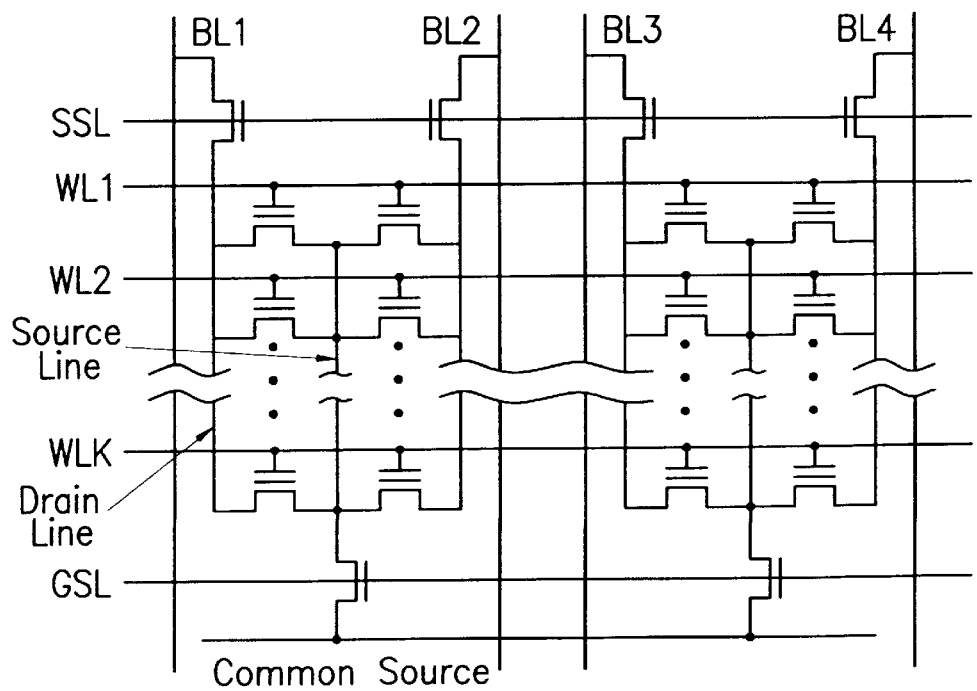
Figure 1E:
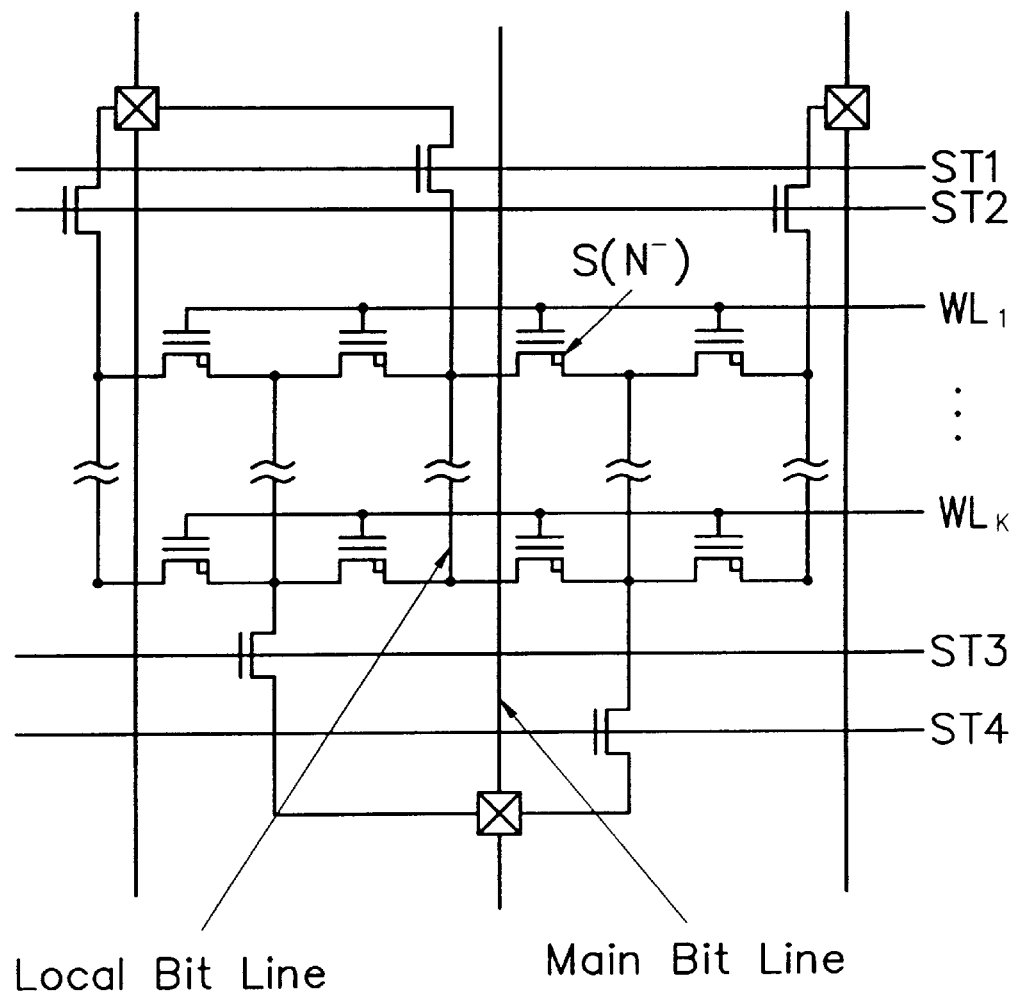
Figure 2:
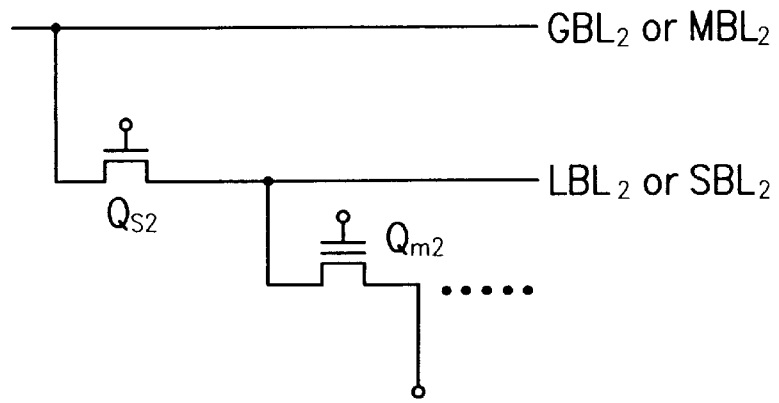
FIG. 2 is an equivalent circuit drawing of the structure of a conventional flash memory.
Figure 3A:
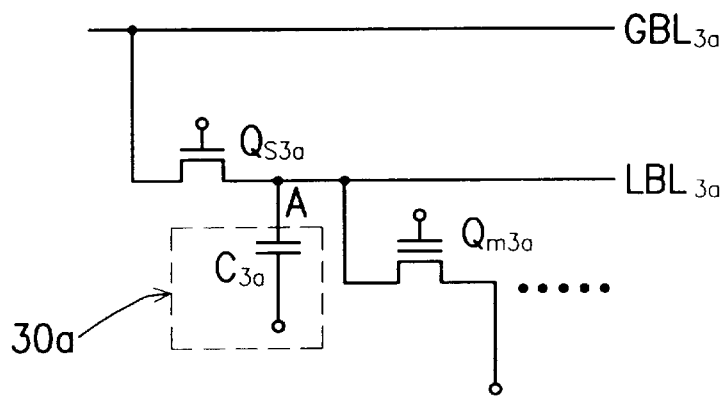
FIGS. 3A to 3B show an equivalent circuit of the flash memory cell in a preferred embodiment of the invention.
Figure 3B:
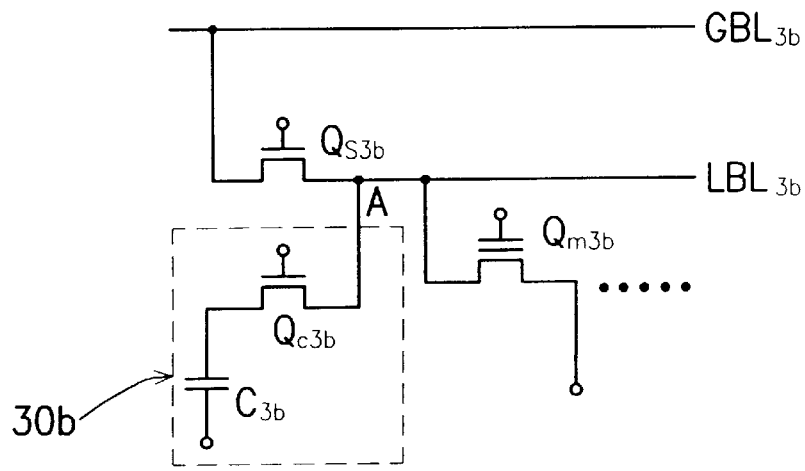

Referring to FIG. 3A and FIG. 3B, the equivalent circuits of ultra-fast flash memory arrays in a preferred embodiments according to the invention are shown. Comparing FIG. 3A and FIG. 3B to FIG. 2, it is known that the capacitor $C_{3a}$ in the dash-line block 30a, and the capacitor $C_{3b}$ and the controlling transistor $Q_{c3b}$ in the dash-line block 30b are the characteristic circuits of the invention. The memory cell transistors $Q_{m3a}$, $Q_{m3b}$ are transistors with a floating gate, respectively. However, it is only a representative structure of a memory cell transistor. It does not mean that this kind of structure is the only kind of memory cell which can be used in the invention. In fact, all kinds of memory cell transistor structures can be applied in the memory array structure in the invention. For example, J. S. Lyu et al. disclosed an MFSFET in the paper "Metal-Ferroelectric-Semiconductor Field-Effect Transistor (MFSFET) for the single Transistor Memory by Using Poly-Si Source/Drain and $BaMgF_4$ Dielectric, IEEE Tech. Dig. IEDM, pp.503–506". The MFSFET structure can be used as an memory cell transistor, and applied in the memory array structure in the invention.

In FIG. 3A, the select transistor $Q_{s3a}$ and the memory cell transistor $Q_{m3a}$ form the basic structure of a flash memory. On the other hand, the select transistor $Q_{s3a}$ and the capacitor $C_{3a}$ form the basic structure of the DRAM. Thus, the UP flash memory structure provided in the invention is to combine a DRAM structure with a flash memory structure. In the figure, memory cell transistor $Q_{m3a}$ is a metal-oxide semiconductor (MOS) with a floating gate used as a memory cell. The charge ejected out of the floating gate is controlled according to Fowler-Nordheim tunneling effect between gate and drain, and the threshold voltage is a reference for recording signals. While writing into memory, the capacitor $C_{3a}$ and the select transistor $Q_{s3a}$ are operated as a DRAM. Firstly, the select transistor $Q_{s3a}$ is charged to an "on" status to transfer the magnitude of the voltage which represents the magnitude of signal from the global bit line $GBL_{3a}$, and store the transferred charge into the capacitor $C_{3a}$ at the terminal A. The select transistor $Q_{s3a}$ is then turned "off", and therefore, the global bit line $GBL_{3a}$ can be used to transfer next signal to other capacitors controlled by other select transistors. While writing or executing other action in other memory cell, the voltage difference between the drain (terminal A) and the gate (word line) of the selected cells programs or inhibits programming.

The difference between FIG. 3A and FIG. 3B is the extra controlling transistor $Q_{c3b}$ in FIG. 3B. The main function of controlling transistor $Q_{c3b}$ is to isolate the capacitor $C_{3b}$. For example, while writing the memory cell, controlling transistor $Q_{3cb}$ is always in an "on" status. While erasing or reading (reading speed lowers with increasing capacitance), the controlling transistor is in an "off" status and thus, isolates the capacitor $C_{3b}$ to avoid the interference produced in the circuit.

Figure 3C:
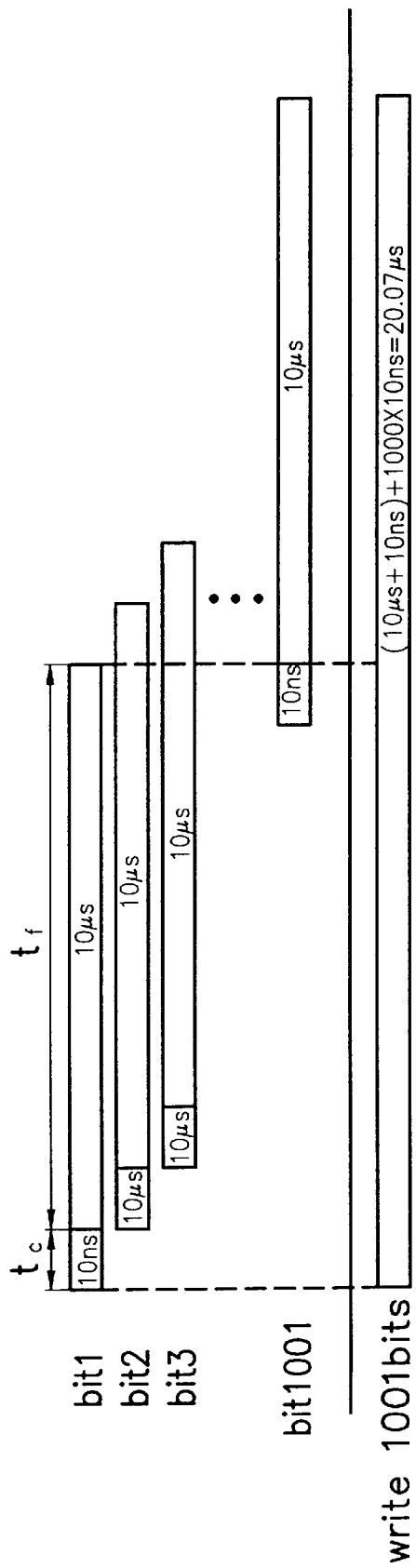
FIGS. 3C and 3D illustrate processing time charts for both a conventional UP flash memory and one fabricated in accordance with the invention.
Figure 3D:
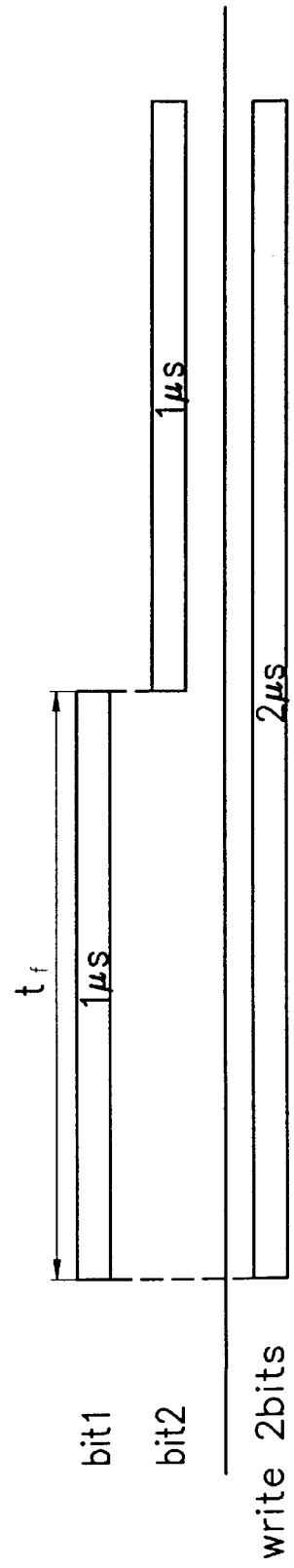

FIG. 3C shows the processing time chart while coding the UP flash memory provided in the preferred embodiment according to the invention. FIG. 3D shows the processing time chart while coding a conventional UP flash memory. The processing time $t_c$ of writing the capacitor $C_{3a}$ (FIG. 3A) in the memory structure in the invention is about 1 ps to 100 ns, while writing the flash memory cell needs a time $t_f$ of about 0.1 $\mu$s to 10 $\mu$s. Referring to FIG. 3C and FIG. 3D, assuming that $t_c$ is 10 ns and $t_f$ is 10 $\mu$s. It is known that to write 1001 bits in the memory structure in the invention, a time duration of about 20.01 $\mu$s is needed, while 20 $\mu$s is needed to write 2 bit in a conventional flash memory structure. Thus, to write a bit in the memory in the invention, 20.01 $\mu$s/1001 bits=20 ns/bit is needed, while writing a bit in a conventional flash memory needs 20$\mu$s/2 bits=10 $\mu$s/bit. Therefore, the array structure of the UP flash memory in the invention is operated in a speed of 500 times (The ratio could be different with different design) of a conventional flash memory.

Methods of fabricating the above UP flash memory structure in the preferred embodiments according to the invention are described as follows.

Method 1

Figure 4:
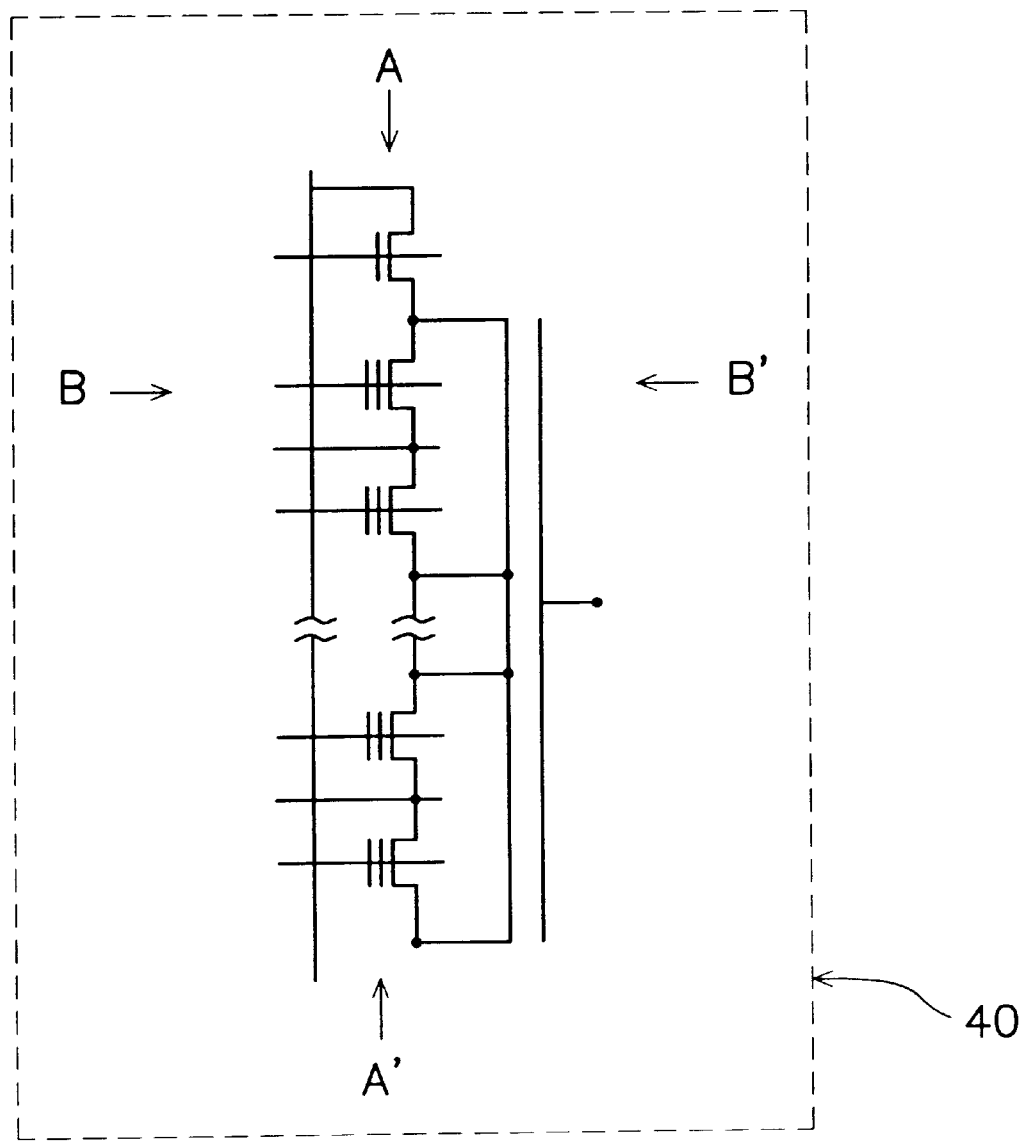
FIG. 4 shows the structure of a ultra-fast pseudo-dynamic nonvolatile flash memory array in a preferred embodiment of the invention.

Referring to FIG. 4 and FIG. 4A to FIG. 4F. FIG. 4 shows the array structure 40 of a UP flash memory in the second embodiment according to the invention. FIG. 4A to FIG. 4F are cross-sectional view of the fabricating process of the array 40.

FIG. 4A(*a*) is a cross section view of FIG. 4 along the intercepting line AA', and FIG. 4A(*b*) a cross section view of FIG. 4 along the intercepting line BB'. A silicon substrate 40*a* with a P-well 40*a'* formed therein is provided. The substrate 40*a* is divided into a memory cell region 400*a* and a peripheral region 400*b*. A field oxide layer 40*b* is formed on the substrate 40*a* for electrical isolation. On the memory cell region 400*a* of the substrate 40*a*, a first gate oxide 40*c* is formed. A first polysilicon layer 40*d* is formed and doped by a first N-type dopant on the memory cell region 400*a* of the substrate 40*a*. The thickness of the field oxide layer 40*d* is about 2000 Å to 4000 Å, and it is about 60 Å to 150 Å for the first gate oxide 40*c* and 1500 Å for the first polysilicon layer. The doping process including the implantation of phosphorus ion with a concentration of about 2E15 cm$^{-2}$ to 5E15 cm$^{-2}$ at an energy of about 30 KeV to 80 KeV.

FIG. 4B(*a*) is a cross section view of FIG. 4 along the intercepting line AA', and FIG. 4B(*b*) a cross section view of FIG. 4 along the intercepting line BB'. A dielectric layer, such as an ONO layer 40*e* is formed on the memory cell region 400*a* of the substrate 40*a*. A second gate oxide layer 40*f* is formed on the peripheral region 400*b* of the substrate 40*a*. A second polysilicon layer 40*g* is formed over the substrate 40*a*. The second polysilicon layer 40*g* on the peripheral region 400*b* is to be etched first and form a gate layer 40*h*1. The second polysilicon layer 40*g* on the memory cell region, the ONO layer 40*e*, and the first polysilicon layer 40*d* form a stacked gate layer 40*h*2.

Figure 4C:
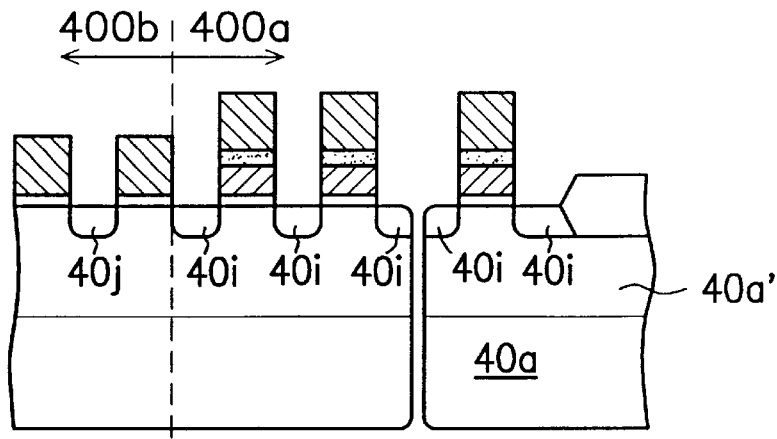

FIG. 4C is a cross section view of FIG. 4 along the intercepting line AA'. A part of the field oxide layer 40*b* (not shown) is removed by self-aligned-source etching. A second N-type dopant is implanted into the memory cell region 400*a* by medium doped drain (MDD) ion implantation to form first doped regions 40*i*. A third N-type dopant is implanted into the peripheral region by light doped drain (LDD) ion implantation to form second doped regions 40*j*. For example, the MDD ion implantation is performed by arsenic ions with an energy at about 20 KeV to 60 KeV, and a concentration of about 3×10$^{15}$ cm$^{-2}$, while the LDD is performed by arsenic ions with an energy at about 20 KeV to 60 KeV, and a concentration of about 1.5×10$^{13}$ cm$^{-2}$.

Figure 4D:
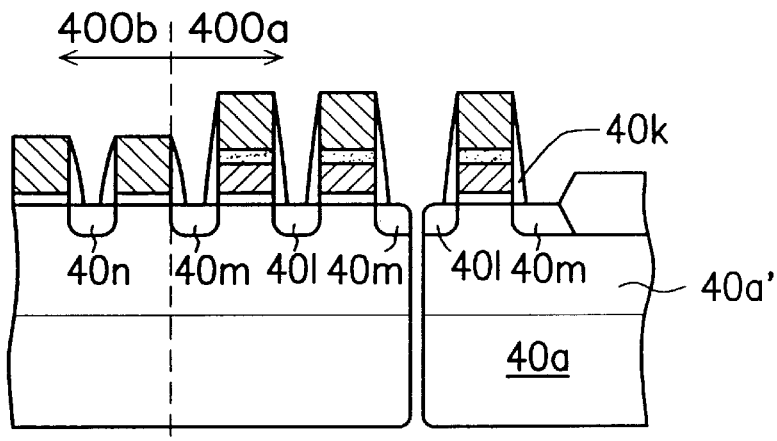

FIG. 4D is a cross section view of FIG. 4 along the intercepting line AA'. An oxide spacer layer 40*k* is formed on the substrate 40*a*. A fourth N-type dopant is implanted into the memory cell region 400*a* of the substrate 40*a* to form first sources 401, first drains 40*m*, and a second source 40*n*. The step of self-aligned-source etching to remove a part of field oxide layer 40*b* is to ensure that first sources 401 are mutually connected. The fourth N-type dopant is implanted into source/drain region with arsenic ions at an energy of about 20 KeV to 60 KeV with a concentration of about 1E13 cm$^{-2}$ to 4E13 cm$^{-2}$.

Figure 4E:
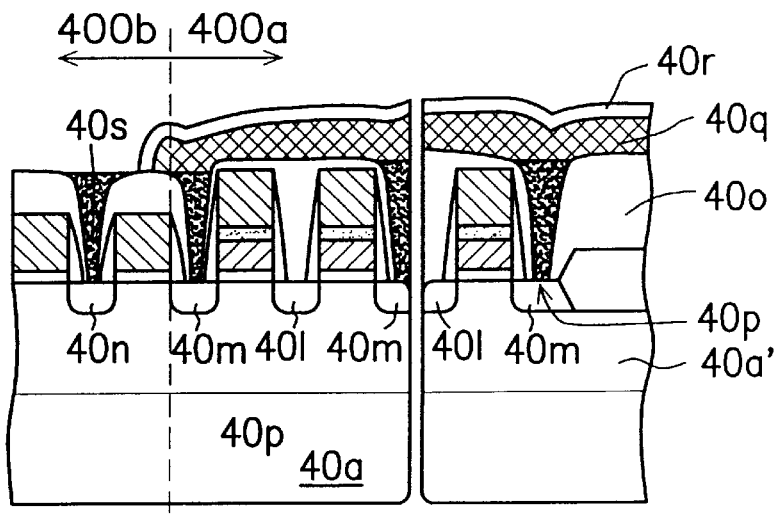

FIG. 4E is a cross section view of FIG. 4 along the intercepting line AA'. A first oxide layer 40*o* is formed over the substrate 40*a*. An opening 40*p* is formed within the first oxide layer 40*o*, so that the first drains 40*m* and the second source 40*n* are exposed. A tungsten plug is formed and fills the opening 40*p*. A third polysilicon layer 40*q* is formed on the memory cell 400*a* of the substrate 40*a*, implanted by a fifth N-type dopant, and etched and patterned. An oxy-nitride layer 40*r* is formed and patterned over the substrate 40*a* to cover the entire third polysilicon layer 40*q*. The thickness of the first oxide layer 40*o* is about 0.5 $\mu$m to 2 $\mu$m, and it is about 2000 Å to 4000 Å for the third polysilicon layer 40*q*. The third polysilicon layer 40*q* is doped with arsenic ions of the concentration about 5E15 cm$^{-2}$ at an energy of about 30 KeV to 80 KeV, and thickness of the oxy-nitride 40*r* is about 50 Å to 200 Å.

Figure 4F:
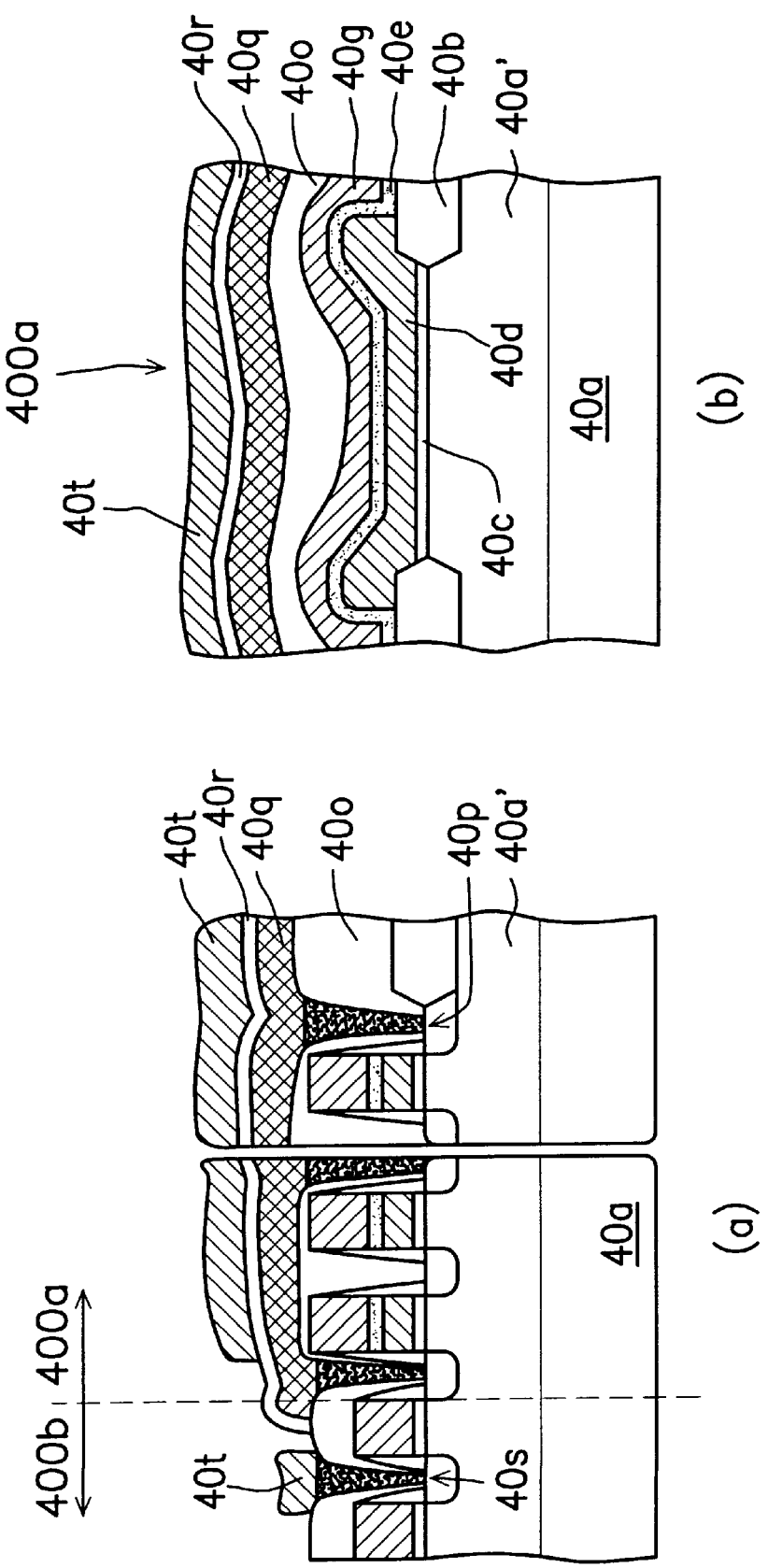

FIG. 4F(*a*) is a cross section view of FIG. 4 along the intercepting line AA'. FIG. 4F(*b*) is a cross section view of FIG. 4 along the intercepting line BB'. A first metal layer 40*t* is formed and patterned.

The third polysilicon layer 40*q* is a local bit line of a flash memory array structure. The third polysilicon layer 40*q*, the oxy-nitride layer 40*r*, and the first metal layer 40*t* form a capacitor of a flash memory array structure.

Method 2

Referring to FIG. 5 and FIG. 5A to FIG. 5F, FIG. 5 shows the array structure 50 of a UP flash memory in the second embodiment according to the invention. FIG. 5A to FIG. 5F are cross-sectional view of the fabricating process of the array 50.

Figure 5:
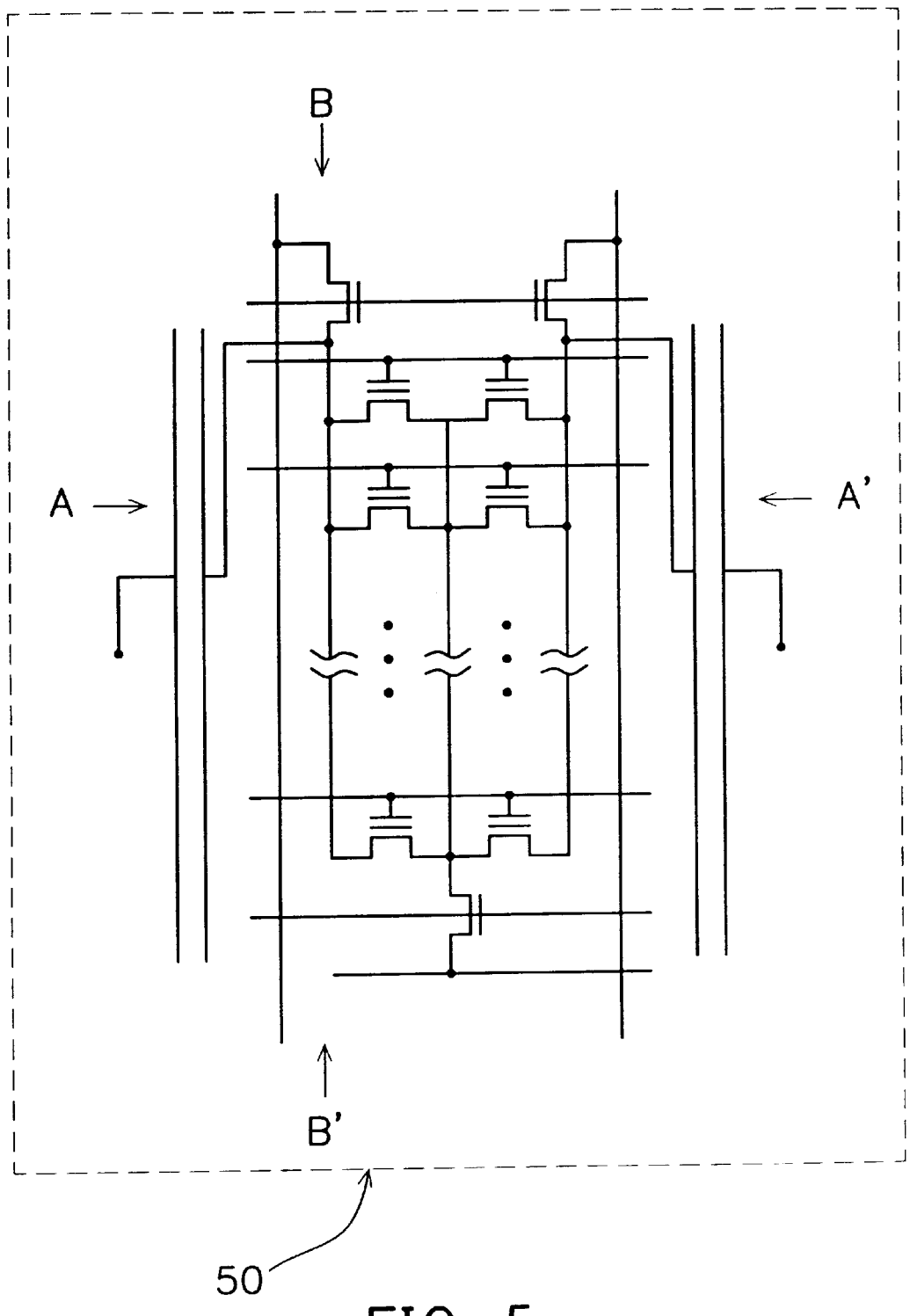
FIG. 5 shows another the structure of another ultra-fast pseudo-dynamic nonvolatile flash memory array in another preferred embodiment of the invention.
Figure 5A:
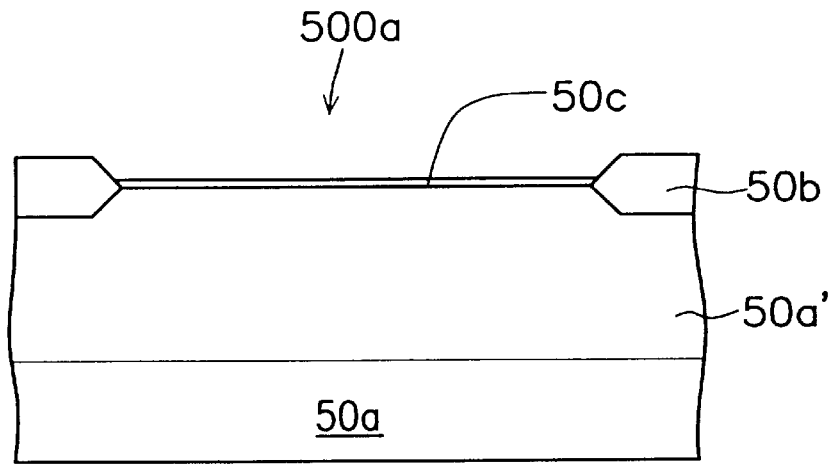
FIGS. 5A to 5I are cross sectional views of the fabricating process of the memory structure in FIG. 5.

FIG. 5A is a cross section view of FIG. 5 along the intercepting line AA'. A silicon substrate 50*a* with a P-well 50*a'* formed therein is provided. The substrate 50*a* is separated into a memory cell region 500*a* and a peripheral region 500*b*. A field oxide layer 50*b* is formed on the substrate 50*a* for electrical isolation. On the memory cell region 500*a* of the substrate 50*a*, a first gate oxide 50*c* is formed. The thickness of the first field oxide layer 50*b* is about 2000 Å to 4000 Å, and it is about 60 Å to 150 Å for the first gate oxide layer 50*c*.

Figure 5B:
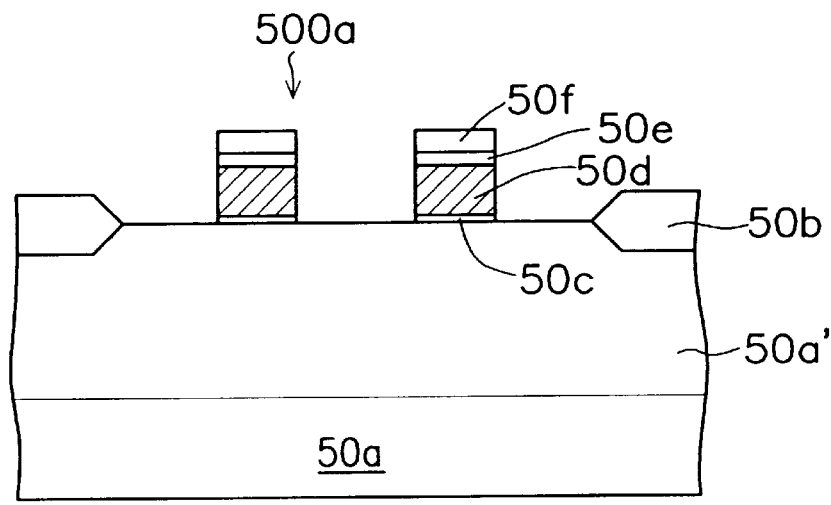

FIG. 5B is a cross section view of FIG. 5 along the intercepting line AA'. A first polysilicon layer 50*d* is formed and doped by a first N-type dopant on the memory cell region 500a of the substrate 50a. A pad oxide layer 50e and a nitride layer 50f are formed on the first polysilicon layer 50d in sequence. The first nitride layer 50f, the first pad oxide layer 50e, the first polysilicon layer 50d, and the first gate oxide layer 50c are etched to form a floating gate structure. The first polysilicon layer 50d is about 1500 Å thick and is doped by phosphorus ions with a concentration of about 1E20 cm$^{-2}$ to 5E20 cm$^{-2}$. The thickness of the first pad oxide layer 50e is about 200 Å to 400 Å, and about 500 Å to 1000 Å for the first nitride layer 50f.

Figure 5C:
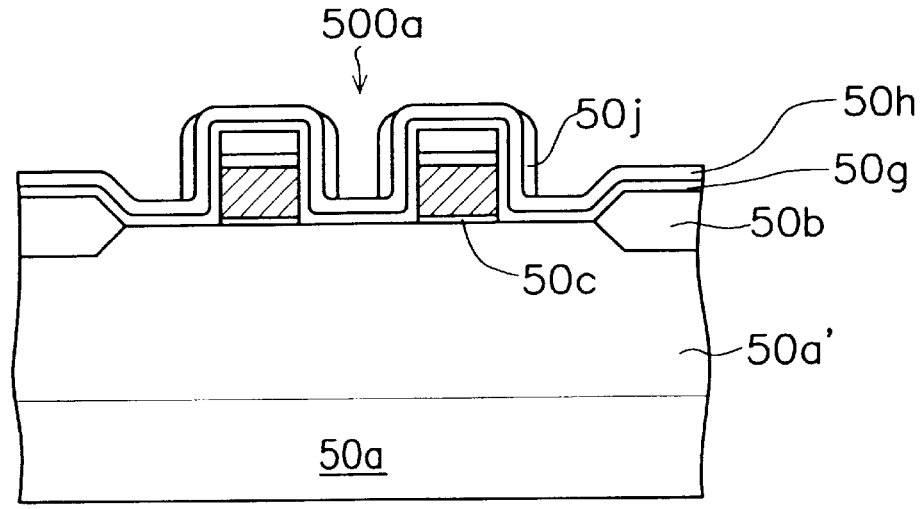

FIG. 5C is a cross section view of FIG. 5 along the intercepting line AA'. A second pad oxide layer 50g, a second nitride layer 50h, and a first oxide layer 50i (not shown) are formed on the memory cell region 500a of the substrate 50a. The first oxide layer 50i is etched back to form an oxide spacer layer 50j. The thickness of the second pad oxide layer 50g is about 200 Å to 400 Å, and it is about 500 Å to 1000 Å for the second nitride layer 50h, and 1000 Å to 2000 Å for the first oxide layer 50i.

Figure 5D:
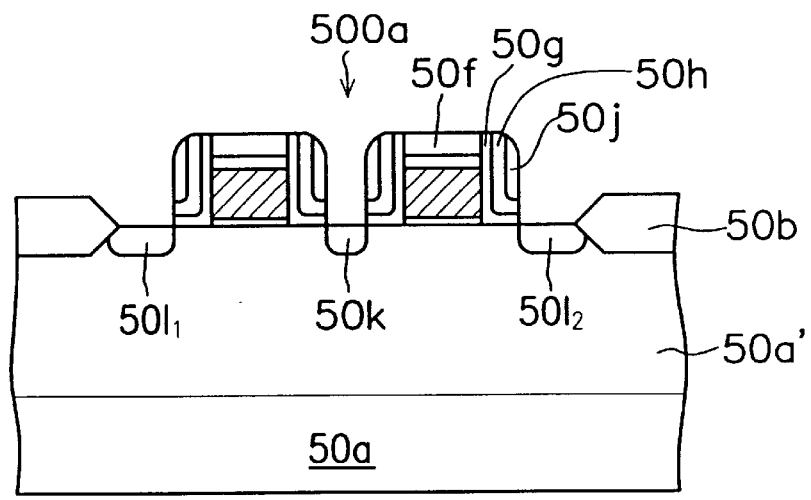

FIG. 5D is a cross section view of FIG. 5 along the intercepting line AA'. Referring to FIG. 5D and FIG. 5C, the second nitride layer 50h and the second pad oxide layer 50g which are not covered by the oxide spacer layer 50j are etched away. A second N-type dopant is implanted into the memory cell region 500a of the substrate 50a, and a first source 50k, a first drain 501$_1$, and a second drain 501$_2$ are formed. The second N-type dopant is arsenic ions with an energy of about 20 KeV to 40 KeV and a concentration of about 5×10$^{15}$ cm$^{-2}$.

Figure 5E:
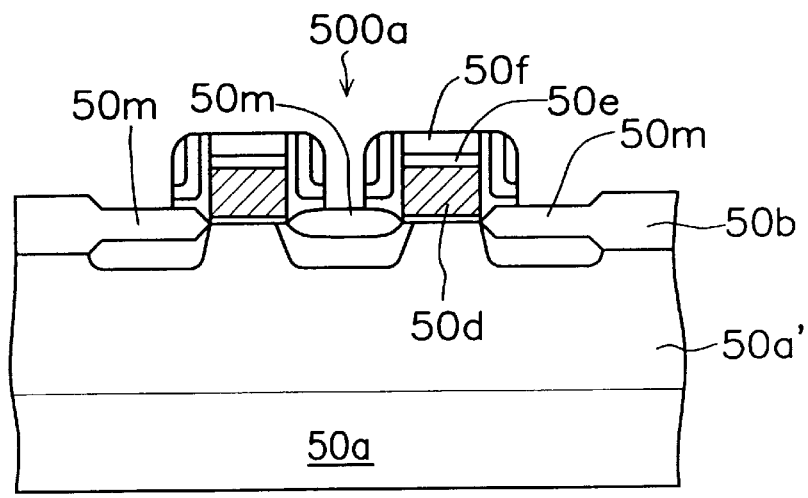

FIG. 5E is a cross section view of FIG. 5 along the intercepting line AA'. A self-aligned oxide layer 50m is formed by self-aligned thermal oxidation (SATO) to isolate the word line from the buried diffusion region of the memory array structure. The buried region is the first source 50k, the first drain 501$_1$, and the second drain 501$_2$.

Figure 5F:
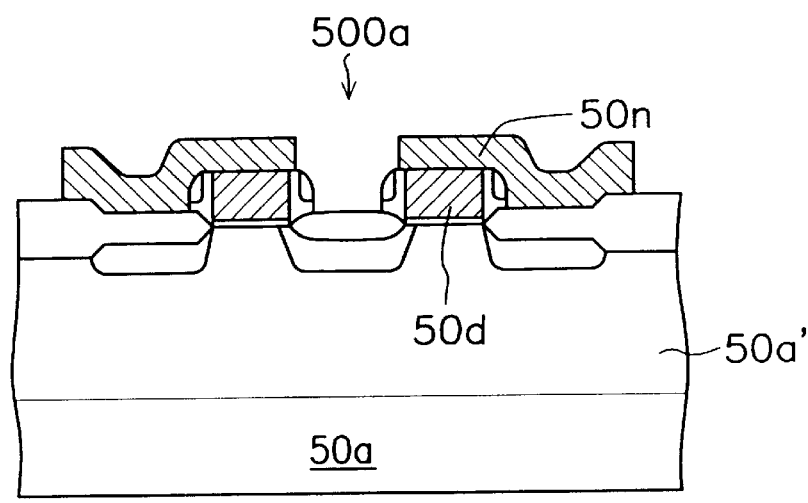

FIG. 5F is a cross section view of FIG. 5 along the intercepting line AA'. Referring to FIG. 5F and 5E, the first nitride layer 50f and the first oxide layer 50e over the first polysilicon layer 50d are removed to expose the first polysilicon layer 50d. On the memory cell region 500a of the substrate 50a, a second polysilicon layer 50n is formed and implanted by a third N-type dopant. The second polysilcon layer 50n is then etched and patterned. The third N-type dopant is phosphorus ions with a concentration of about 10$^{20}$ cm$^{-2}$ to 5×10$^{20}$ cm$^{-2}$.

Figure 5G:
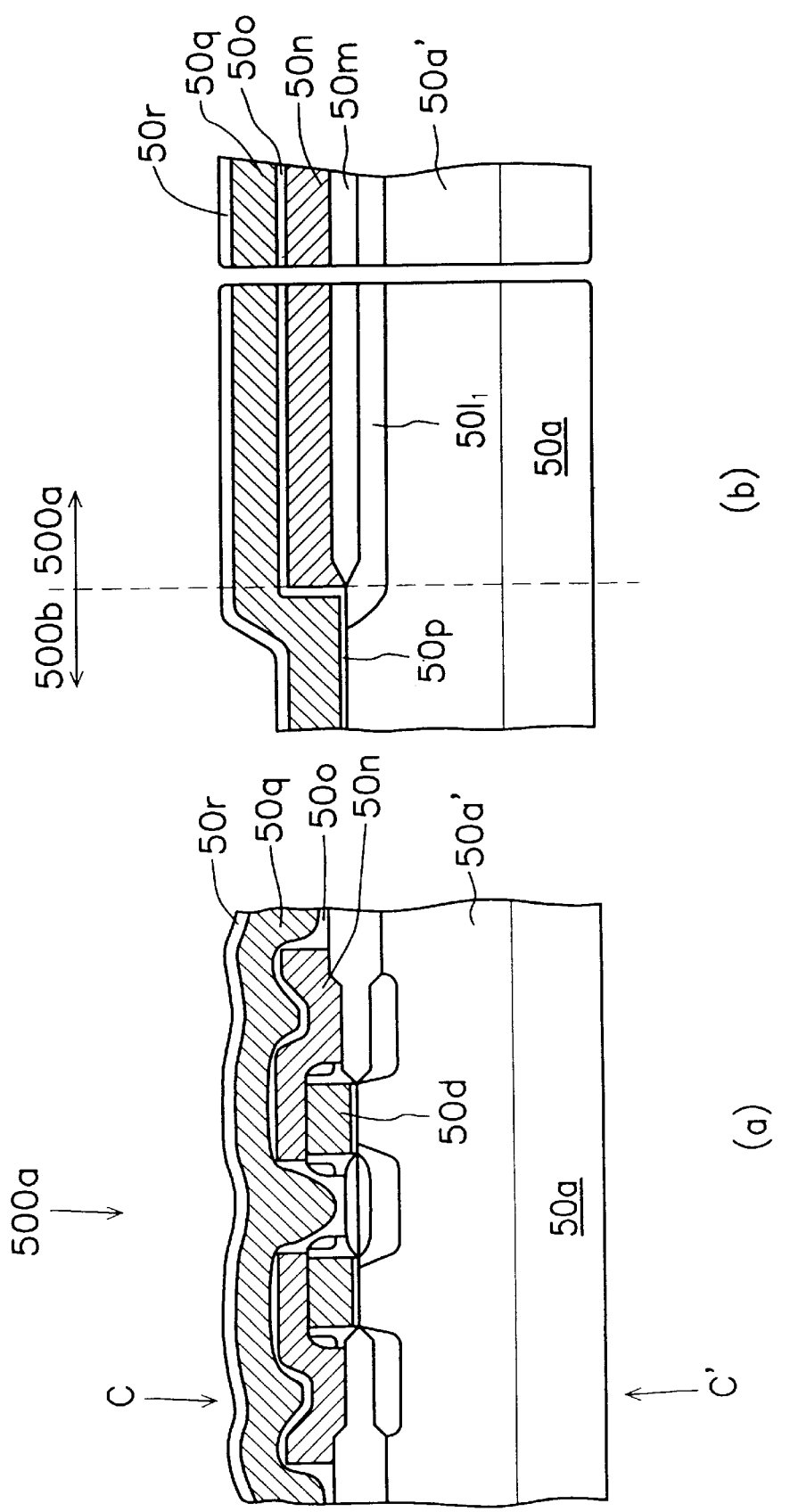

FIG. 5G(a) is a cross section view of FIG. 5 along the intercepting line AA'. FIG. 5G(b) is a cross section view of FIG. 5 along the intercepting line BB', or a cross section view of FIG. 5(a) along the intercepting line CC'. A dielectric layer, such as an ONO layer 50o is formed on the memory cell region 500a of the substrate 50a. A second gate oxide layer 50p is formed on the peripheral region 500b of the substrate 50a. A third polysilicon layer 50q is formed over the substrate 50a and implanted by a fourth N-type dopant. On the third polysilicon layer 50q, a titanium silicide layer 50r is formed. The titanium silicide layer 50r and the third polysilicon layer 50q are combined as a polycide layer. The thickness of the ONO layer 50o is about 60 Å–80 Å/60 Å–20 Å/60 Å–80 Å, and the thickness of the third polysilicon layer is about 1500 Å to 2000 Å. The third polysilicon layer 50q is doped with arsenic ions at an energy of about 30 KeV to 60 KeV with a concentration of about 5×10$^{15}$ cm$^{-2}$. With the formation of the titanium silicide layer over the third polysilicon layer 50q, a low resistance of can be obtained.

Figure 5H:
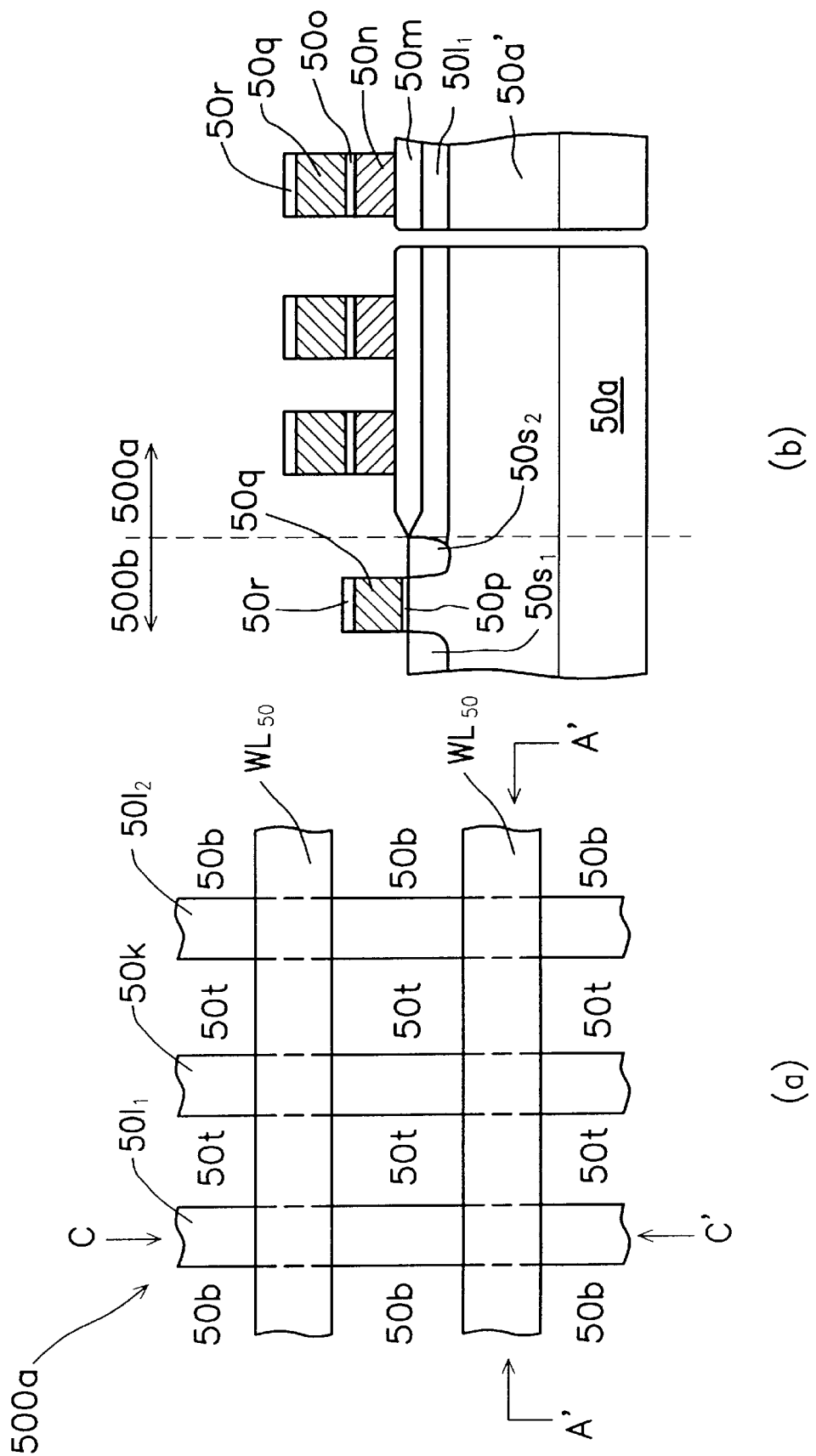

FIG. 5H(a) shows the top view of FIG. 5. FIG. 5H(b) is a cross section view of FIG. 5 along the intercepting line BB', or a cross section view of FIG. 5(a) along the intercepting line CC'. The titanium silicide layer 50r, the third polysilicon layer 50q, and the second gate oxide layer 50p on the peripheral region 500b of the substrate 50a are etched. A fifth N-type dopant is implanted into the peripheral region 500b of the substrate 50a to form a third drain 50s, and a third source 50s$_2$. The third source 50s$_2$ is connected to the first drain 501$_1$. The titanium silicide layer 50r, the third polysilicon layer 50q, the ONO layer 50o, the second polysilicon layer 50n, and the first polysilicon layer 50d on the memory cell region 500a of the substrate 50a are etched to form a word line WL$_{50}$ as shown in the figure. A first P-type dopant is implanted into the memory cell region 500a of the substrate 50a to form a P-type doped region 50t for the purpose of isolating the word line WL$_{50}$. The word line WL$_{50}$ is formed by the third polysilicon layer 50q and the titanium silicide layer 50r. The P-type dopant is boron ions with an energy at about 20 KeV to 40 KeV and a concentration of about 5×10$^{13}$ cm$^{-2}$.

Figure 5I:
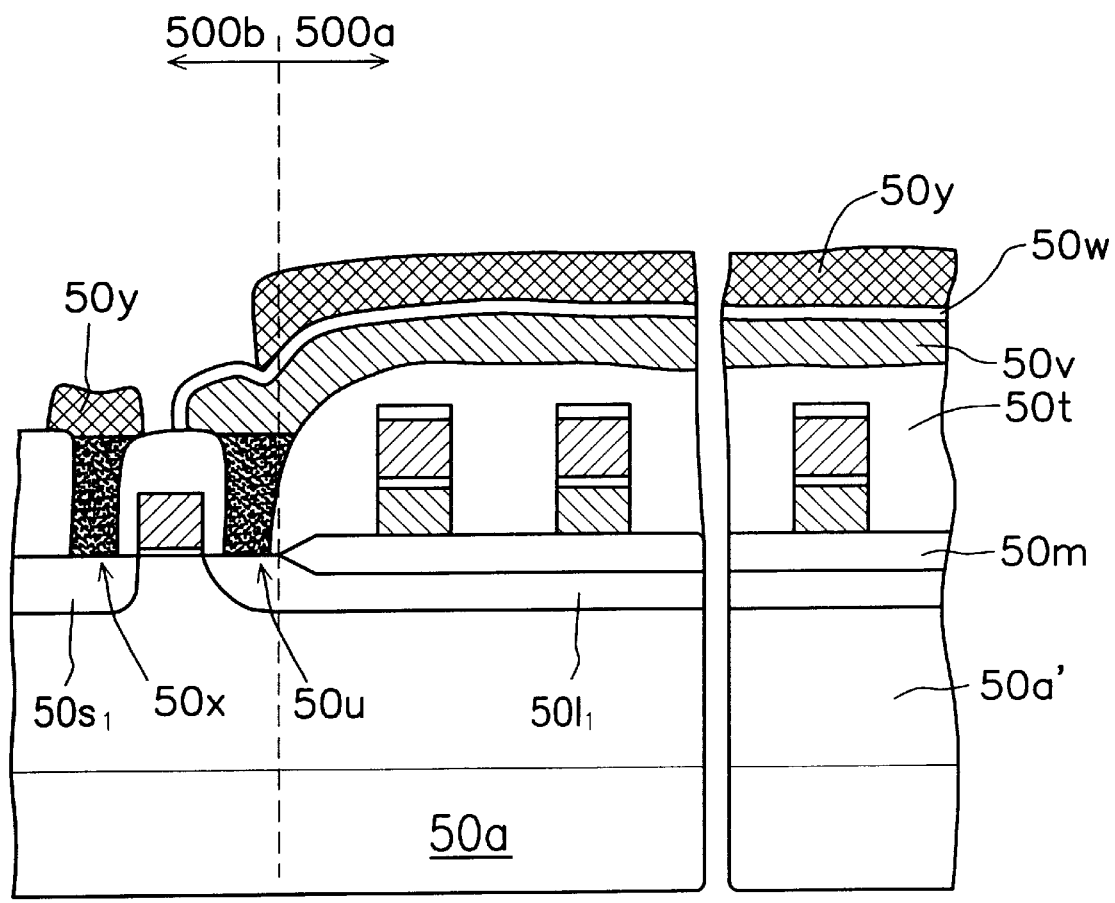

FIG. 5I is a cross section view of FIG. 5 along the intercepting line BB', or a cross section view of FIG. 5H(b) along the intercepting line CC'. A second oxide layer 50t is formed over the substrate 50a. A first opening 50u is formed within the second oxide layer 50t and exposes the first drain 501$_1$ and the third drain 50S$_1$. The first opening 50u is filled by a tungsten plug. On the second oxide layer 50t, a fourth polysilicon layer 50v is formed The fourth polysilicon layer 50v is implanted by a fourth N-dopant and etched and patterned to form the same pattern as the first drain 501$_1$. An oxy-nitride layer 50w is formed and patterned on the entire surface of the fourth polysilicon layer 50v. Over the substrate 50a, a metal layer 50y is formed and patterned.

The metal layer 50y, the oxy-nitride layer 50w, and the fourth polysilicon layer 50v on the memory cell region 500a form the capacitor structure. The third polysilicon layer 50q and the titanium silicide layer 50r on the memory cell region 500a form the word line. The fourth polysilicon layer 50v is the local bit line.

In the two methods mentioned above, a fabricating method of a UP flash memory is provided and interpreted by the memory array structure 40 and 50 shown in FIG. 4 and FIG. 5, respectively. However, these fabricating methods can form the structure of the dash-line block 3b in FIG. 3B. The only difference is the pattern of the mask.

Other embodiments of the invention are apparent to those skilled in the art from consideration of the specification and practice of the invention disclosed herein. It is intended that the specification and examples to be considered as exemplary only, with a true scope and spirit of the invention being indicated by the following claims.

What is claimed is:

1. A fabricating method of an ultra-fast pseudo-dynamic nonvolatile flash memory, wherein a characteristic of the memory is to comprise a capacitor coupled to a local bit line, the method comprising:

providing a substrate with a P-well, dividing the substrate into a memory cell region and a peripheral region, forming a field oxide layer on the substrate for electrical isolation;

forming a first gate oxide layer and a first polysilicon layer on the memory cell region of the substrate in sequence, and implanting a first N-type dopant into the first polysilicon layer;

forming a dielectric layer on the memory cell region of the substrate;

forming a second gate oxide layer on the peripheral region of the substrate;

forming a second polysilicon layer over the substrate;

etching the second polysilicon layer on the peripheral region to form a gate layer;

etching the second polysilicon layer, the dielectric layer, and the first polysilicon layer on the memory cell region to form a stacked layer on the memory cell region;

removing a part of the field oxide layer by self-aligned-source etching, implanting a second N-type dopant into the memory cell region of the substrate by medium doped drain ion implantation to form a plurality of first doped regions;

implanting a third N-type dopant into the peripheral region of the substrate by lightly doped drain ion implantation to form a plurality of second doped regions;

forming an oxide spacer layer over the substrate, implanting a fourth N-type dopant to perform a source/drain ion implantation and form a plurality of first sources and a plurality of first drains on the memory cell regions of the substrate, and a second source on the peripheral region of the substrate, wherein a step of the self-aligned-source etching to remove the part of the field oxide layer is to connect the first sources;

forming a first oxide layer and a first opening therein to expose the first and the second drains;

forming a tungsten plug to fill the contact;

forming a third polysilicon layer which covers the memory cell region of the substrate;

forming a oxy-nitride layer to cover the third polysilicon layer entirely; and covering a first metal layer over the substrate and patterning the first metal layer;

wherein, the first metal layer on the memory cell region, the oxy-nitride layer, and the third polysilicon layer form the capacitor, while the third polysilicon layer forms the local bit line.

2. The method as claim 1, wherein the field oxide layer is about 2000 Å to 4000 Å.

3. The method as claim 1, wherein the first gate oxide layer is about 60 Å to 150 Å.

4. The method as claim 1, wherein the first polysilicon layer is about 5000 Å.

5. The method as claim 1, wherein the first polysilicon layer is doped by phosphorus ions with a concentration of 1E20 $cm^{-2}$ to 5E20 $cm^{-2}$.

6. The method as claim 1 wherein the dielectric layer is an oxide/nitride/oxide layer.

7. The method as claim 1, wherein the medium doped drain ion implantation is performed by arsenic ions at an energy of 20 KeV to 60 KeV with a concentration of about 3E15 $cm^{-2}$.

8. The method as claim 1, wherein the lightly doped drain ion implantation is performed by arsenic ions at an energy of about 20 KeV to 60 KeV with a concentration of 1.5E13 $cm^{-2}$.

9. The method as claim 1, wherein the source/drain ion implantation is performed by arsenic ions at an energy of 20 KeV to 60 KeV with a concentration of $5 \times 10^{15}$ $cm^{-2}$.

10. The method as claim 1, wherein the first oxide layer is about 0.5 $\mu$m to 2 $\mu$m.

11. The method as claim 1, wherein the third polysilicon layer is about 2000 Å to 4000 Å.

12. The method as claim 1, wherein the third polysilicon layer is doped by phosphorus ions with a concentration of 5E20 $cm^{-2}$.

13. The method as claim 1, wherein the oxy-nitride layer is about 50 Å to 200 Å.

14. A fabricating method of an ultra-fast pseudo-dynamic nonvolatile flash memory, wherein the memory is characterized to comprise a capacitor coupled to a local bit line; the method comprising:

providing a substrate with a P-well, dividing the substrate into a memory cell region and a peripheral region, forming a field oxide in the substrate for electrical isolation;

forming a first gate oxide layer and a first polysilicon layer on the memory cell region of the substrate in sequence, and implanting a first N-type dopant into the first polysilicon layer;

forming a first pad oxide layer and a first nitride layer on the first polysilicon layer and etching the first nitride layer, the first pad oxide layer, and the first polysilicon layer to form a floating gate;

forming a second pad oxide layer, a second nitride layer, and a first oxide layer on the memory cell region of the substrate, etching the first oxide layer to form an oxide spacer layer;

removing the second nitride layer and the second pad oxide layer uncovered by the oxide spacer layer;

implanting a second N-type dopant into the memory cell region of the substrate to form a first source, a first drain, and a second drain;

forming a self-aligned oxide layer by self-aligned thermal oxidation;

removing the first nitride layer and the first oxide layer on the first polysilicon layer to expose the first polysilicon layer;

forming a second polysilicon layer on the memory cell of the substrate and implanting a third N-type dopant therein, and etching and patterning the second polysilicon layer;

forming a dielectric layer on the memory cell region of the substrate;

forming a second gate oxide layer on the peripheral region of the substrate;

forming a third polysilicon layer over the substrate and implanting the third polysilicon layer by a fourth N-type dopant;

forming a titanium silicide layer on the third polysilicon layer;

etching and patterning the titanium silicide layer, the third polysilicon layer, and the second gate oxide layer on the peripheral region, and implanting the peripheral region by a fifth N-type dopant to form a third drain and a third source and connecting the third source to the first drain;

etching and patterning the titanium silicide layer, the third polysilicon layer, the dielectric layer, the second polysilicon layer, and the first polysilicon layer on the memory cell region, implanting the memory cell region by a P-type dopant to form a P-type doped region;

covering a second oxide layer over the substrate and forming a first opening therein to expose the first and the third drains;

forming a tungsten plug to fill the opening;

forming a fourth polysilicon layer on the second oxide, implanting the fourth polysilicon layer by a sixth N-type dopant, etching and patterning the fourth polysilicon layer;

forming a oxy-nitride layer to cover the fourth polysilicon layer entirely and patterning the oxy-nitride layer; and covering a metal layer to at least fill the second opening, etching and patterning the metal layer;

wherein, the metal layer, the oxy-nitride layer, and the fourth polysilicon layer on the memory cell region form the capacitor, while the fourth polysilicon layer forms the local bit line.

15. The method as claim 14, wherein the field oxide layer is about 2000 Å to 4000 Å.

16. The method as claim 14, wherein the first gate oxide layer is about 60 Å to 150 Å.

17. The method as claim 14, wherein the first polysilicon layer is about 1500 Å.

18. The method as claim 14, wherein the first polysilicon layer is doped by boron ions with a concentration of 1E20 $cm^{-2}$ to 5E20 $cm^{-2}$.

19. The method as claim 14, wherein the first pad oxide layer is about 200 Å to 400 Å.

20. The method as claim 14, wherein the first nitride layer is about 500 Å to 1000 Å.

21. The method as claim 14, wherein the second pad oxide layer is about 200 Å to 400 Å.

22. The method as claim 14, wherein the second nitride layer is about 500 Å to 1000 Å.

23. The method as claim 14, wherein the first oxide layer is about 1000 Å to 2000 Å.

24. The method as claim 14, wherein the second N-type dopant is arsenic ions at an energy of about 20 KeV to 40 KeV with a concentration of 5E15 $cm^{-2}$.

25. The method as claim 14, wherein the second polysilicon layer is doped by phosphorus ions with a concentration of $1 \times 10^{20}$ $cm^{-2}$ to $5 \times 10^{20}$ $cm^{-2}$.

26. The method as claim 14, wherein the dielectric layer is an oxide/nitride/oxide layer with a thickness of about 60 Å–80 Å/60 Å–120 Å/60 Å–80 Å.

27. The method as claim 14, wherein the third polysilicon layer is about 1500 Å to 2000 Å.

28. The method as claim 14, wherein the third polysilicon layer is implanted by arsenic ions at an energy of about 30 KeV to 60 KeV with a concentration of about 5E15 $cm^{-2}$.

29. The method as claim 14, wherein with the formation of the titanium silicide layer on the third polysilicon layer, a low resistance titanium silicide can be obtained.

30. The method as claim 14, wherein the first P-type dopant is boron ions with a concentration of $5 \times 10^{13}$ $cm^{-2}$ at an energy of about 20 KeV to 40 KeV.

* * * * *